(12) United States Patent
Cowburn et al.

(10) Patent No.: US 6,614,084 B1
(45) Date of Patent: Sep. 2, 2003

(54) MAGNETIC MATERIALS

(75) Inventors: Russell Cowburn, Cambridge (GB); Mark Welland, Cambridge (GB)

(73) Assignee: Cambridge University Technical Services Ltd., Cambridge (GB)

(*) Notice: Subject to any disclaimer, the term of this patent is extended or adjusted under 35 U.S.C. 154(b) by 0 days.

(21) Appl. No.: 09/958,318

(22) PCT Filed: Apr. 7, 2000

(86) PCT No.: PCT/GB00/01306
§ 371 (c)(1),
(2), (4) Date: Oct. 9, 2001

(87) PCT Pub. No.: WO00/62311
PCT Pub. Date: Oct. 19, 2000

(30) Foreign Application Priority Data

Apr. 9, 1999 (GB) .............................. 9908179

(51) Int. Cl.[7] .................. H01L 27/14; H01L 29/82; H01L 29/84
(52) U.S. Cl. .................. 257/414; 257/421; 205/118; 205/119; 205/122; 205/131; 205/170; 365/145; 365/171; 365/172; 365/173; 365/158; 252/62.51; 252/62.55; 428/611; 428/681; 428/900
(58) Field of Search ................ 257/414, 421; 205/118, 119, 122, 131, 170; 365/145, 171, 172, 173, 158; 252/62.51, 62.55; 428/611, 681, 900

(56) References Cited

U.S. PATENT DOCUMENTS

| | | | | |
|---|---|---|---|---|
| 5,710,436 | A | | 1/1998 | Tanamoto et al. ............ 257/14 |
| 5,714,536 | A | * | 2/1998 | Ziolo et al. ................. 524/430 |
| 5,741,435 | A | * | 4/1998 | Beetz, Jr. et al. ........ 252/62.55 |
| 5,889,300 | A | * | 3/1999 | Ziolo et al. ................. 523/300 |
| 5,898,549 | A | * | 4/1999 | Gill ............................ 360/113 |
| 5,989,406 | A | * | 11/1999 | Beetz, Jr. et al. ........... 205/118 |
| 6,269,018 | B1 | * | 7/2001 | Monsma et al. ............ 365/145 |
| 6,451,220 | B1 | * | 9/2002 | Ziolo et al. .............. 252/62.54 |

OTHER PUBLICATIONS

J. Shen et al., "Magnetism and Morphology of FE/CU(111) Films Below Two–Dimensional Percolation," Journal of Applied Physics, American Institute of Physics, NY, vol. 81, No. 8, part 02A, Apr. 15, 1997, pp. 3901–3902.

Atsushi Maeda et al, "Magnetic Wire and Box Arrays (Invited)," Journal of Applied Physics, American Institute of Physics, NY, vol. 76, No. 10, part 02, Nov. 15, 1994, pp. 6667–6670.

A. Fernandez et al., "Magnetic Force Microscopy of Single–Domain Cobalt Dots Patterned Uisng Interference Lithography," IEEE Transactions on Magnetics, IEEE Inc., NY, vol. 32, No. 5, Sep. 1, 1996, pp. 4472–4474.

Lent, Craig S. et al., "A Device Architecture for Computing with Quantum Dots," Proceedings of the IEEE, vol. 85, No. 4, Apr. 1997.

Tougaw, P. Douglas et al., "Logical Devices Implemented Using Quantum Cellular Automata," Journal of Applied Physics, Jul. 23, 1993.

Snider, G.L. et al., "Quantum–Dot Cellular Automata," Nanotechnology, 4,49 (1993).

Porod, Wolfgang, "Towards Nanoelectronics: Possible CNN Implementations using Nanoelectronic Devices," 1998 IEEE Int. Workshop on Celluar Neural Networks and their Applications, London, England, Apr. 14–17, 1998.

Girlanda, M. et al., "Configuration–Interaction Based Simulation of a Quantum Cellular Automation Cell," Dipartimento di Ingegneria dell'Informazione, Universita degli Studi di Pisa, IEEE 1998.

* cited by examiner

Primary Examiner—David Nelms
Assistant Examiner—Andy Huynh
(74) Attorney, Agent, or Firm—Dykema Gossett, PLLC

(57) ABSTRACT

A memory element comprising nanomagnets having a rotational symmetry selected in order to provide high remanence and a suitable coercivity. There is also a sensor element comprising nanomagnets having a rotational symmetry selected such that they are superparamagnetic and exhibit substantially zero hysteresis so that a magnetisation of the nanomagnets depends only on the current value of applied field and not on the field history.

15 Claims, 8 Drawing Sheets

A

B

500 Oe
400 Oe
300 Oe
200 Oe

C

MAGNETIC MATERIALS

BACKGROUND OF THE INVENTION

This invention relates to magnetic materials and, in particular, to the use of rotational symmetry to tailor the magnetic properties of the materials.

The volume of information which can be stored on a computer hard disk has risen by a factor of $10^7$ in the past 40 years and looks set to continue rising at an exponential rate in coming decades. Today's conventional magnetic materials will be unable to meet the demanding performance requirements of tomorrow's magnetic data storage industry. One option currently being considered is a synergy of nanotechnology and quantum mechanics to make nanometre scale magnetic particles called nanomagnets. These, by virtue of their extremely small size, possess very different magnetic properties from their parent bulk material. Each nanomagnet is analogous to a giant atom of an artificial element, allowing new magnetic materials to be built up giant atom by giant atom. The rapidly growing field of nanomagnetism may provide among other things advanced replacements for hard disk media and a new generation of high speed, low power, non-volatile computer memory chips.

The most important property of a naturally occurring magnetic element or alloy is its anisotropy. This refers to the presence of preferred magnetisation directions within the material and is ultimately responsible for determining the way in which a magnetic material behaves and the technological applications for which it is suitable. In a conventional magnetic material anisotropy arises from the shape and symmetry of the electronic Fermi surface and so is intrinsic to the particular element or alloy and cannot easily be tailored. In nanomagnets, however, the anisotropy depends not only on the band structure of the parent material, but also on the shape of the nanomagnet. One of the most attractive features of artificial magnetic materials is that their magnetic properties can be engineered by the choice of the shape of the constituent nanomagnets.

SUMMARY OF THE INVENTION

According to one aspect of the present invention, a memory element comprises nanomagnets having a rotational symmetry selected in order to provide high remanence and a suitable coercivity.

According to a second aspect of the present invention, a sensor element comprises nanomagnets having a rotational symmetry selected such that they are superparamagnetic and exhibit substantially zero hysteresis so that a magnetisation of the nanomagnets depends only on the current value of applied field and not on the field history.

According to a third aspect of the present invention, a magnetic logic element comprises nanomagnets having a rotational symmetry selected such that they are superparamagnetic and exhibit substantially zero hysteresis so that a magnetisation of the nanomagnets depends only on the current value of applied field and not on the field history.

The devices of the invention are artificial magnetic materials formed on the surface of a substrate, such as a piece of silicon, using a technique such as electron beam lithography. The devices may be in the size range 40–500 nm and in the thickness range 3–10 nm and may be, triangular, or pentagonal geometries which respectively correspond to rotational symmetries of order 3 and 5. The order may, however, be greater. The parent material may be Supermalloy ($Ni_{80}Fe_{14}Mo_5$), which is chosen for two reasons. Firstly, this alloy is intrinsically almost isotropic and so any anisotropy in the nanomagnets must come from their shape. Secondly, Supermalloy and its molybdenum-free relative Permalloy are two of the ubiquitous soft magnetic alloys of industry and research and as such make an effective demonstration of the new and varied properties which can be given to a simple material by nanometric structuring. As described below, we are able to make artificial magnetic materials with an enormously wide range of magnetic properties simply by varying the symmetry of the constituent nanomagnets.

BRIEF DESCRIPTION OF THE DRAWINGS

Examples relating to the present invention will now be described with reference to the accompanying drawings, in which.

DESCRIPTION OF THE INVENTION

Figure 1:
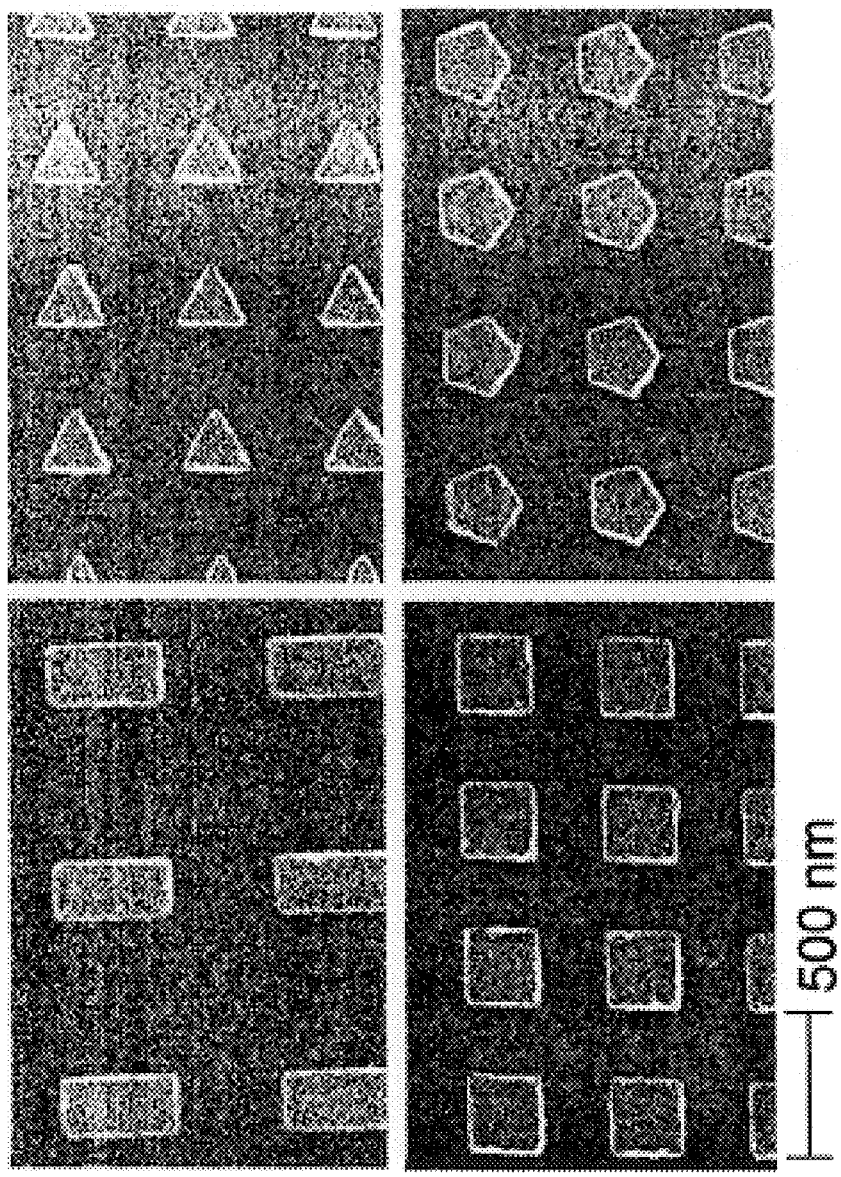
FIG. 1 shows scanning electron micrographs of some of the artificial magnetic materials.

A standard lift-off based electron beam lithography process can be employed to form devices according to the present invention. The sample substrate was oriented single crystal silicon. The spacing between each nanomagnet was always at least equal to the diameter of the nanomagnet, and for the smallest structures was as large as 3 times the diameter. The surface roughness of the nanomagnets was less than 0.5 nm and the microstructure showed 5 nm randomly oriented grains. The top surface of each nanomagnet was covered with a 5 nm thick layer of gold to prevent oxidation. The integrity of the geometric shape was found to be preserved in structures as small as 50 nm in size. FIG. 1 shows Scanning Electron Microscopy images of some of the structures.

In order to determine the magnetic properties of these different artificial materials we measured their hysteresis loops (M-H loops) using a known high sensitivity magneto-optical method. The silicon surface can be viewed under an optical microscope while a laser spot (size≈5 $\mu$m) is moved over the surface until focused on top of one of the patches of artificial material. The reflected laser beam is polarisation analysed in order to access the longitudinal Kerr effect, which serves as a probe of the component of magnetisation lying in the optical plane of incidence. This magnetisation is then recorded while a 27 Hz alternating magnetic field of up to 1000 Oe strength is applied in the plane of the sample. All measurements were performed at room temperature.

Figure 2:
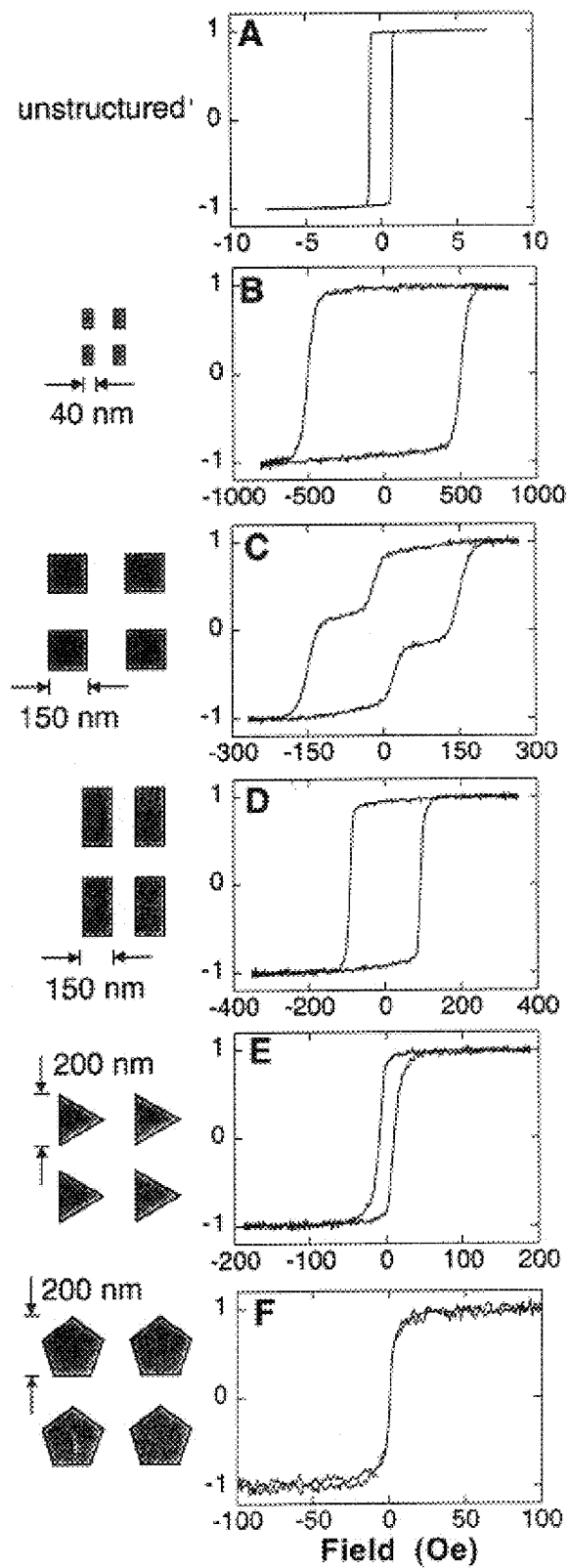
FIG. 2 shows hysteresis loops for nanomagnets of different size, thickness and geometric shape.
Figure 3:
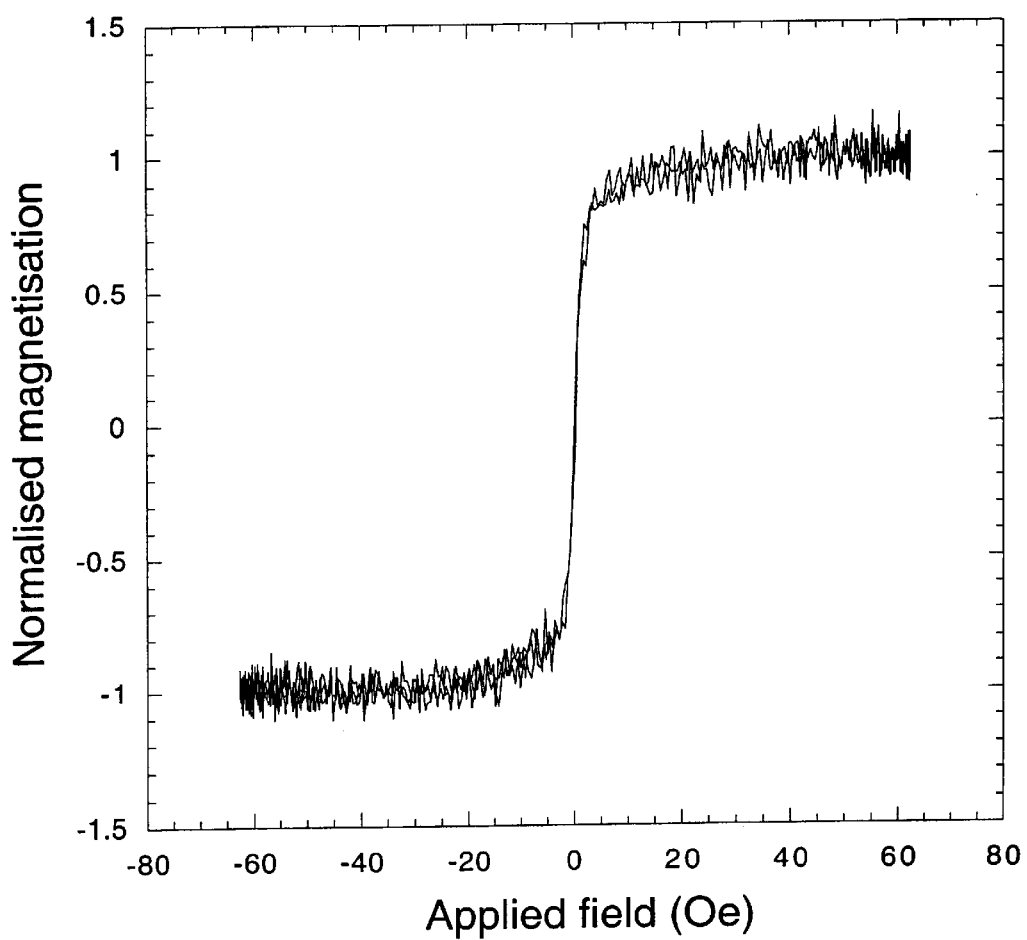
FIG. 3 shows a hysteresis loop for a superparamagnetic triangular nanomagnet.

FIGS. 2 and 3 show some of the hysteresis loops measured from nanomagnets of different size, thickness and geometric shape. One sees immediately that the loops are very different from each other and from that obtained from the conventional unstructured material. The variety of technological applications covered by the samples represented in this figure is considerable. The known small rectangles shown in FIG. 2B could be suitable for making an artificial replacement for hard disk media: the nanomagnets used here could in principle achieve data storage densities in excess of 100 Gbits/inch$^2$, i.e. 10 times greater than today's state-of-the-art conventional media. The known larger rectangles in FIG. 2D would be well suited to Magnetic Random Access Memory (MRAM), an emerging replacement for semiconductor memory: a memory chip using magnetic elements of this size could offer 1 Gbit of non-volatile high speed memory. What is surprising is that a wide range of magnetic properties are manifested by the triangular and pentagonal nanomagnets. The triangles in FIG. 2E, which have a high remanence and a low coercivity, could be employed as a memory element whereas the pentagons of FIG. 2F and the superparamagnetic triangles of FIG. 3 would make an excellent high sensitivity magnetic field sensor or hard disk read head, having an effective relative permeability of 3000 and zero hysteresis. These diverse applications are a direct result of varying the size, thickness and, most importantly, the symmetry of the nanomagnets which make up the artificial material.

Figure 4:
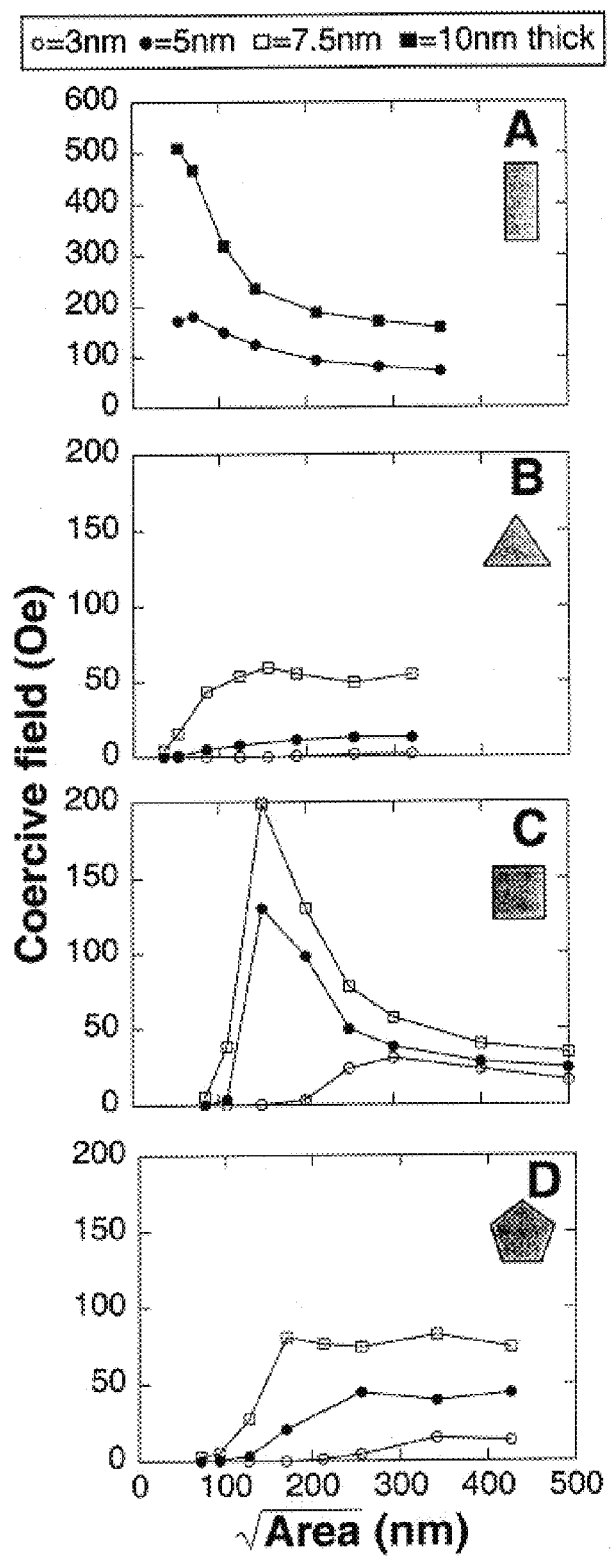
FIG. 4 shows experimentally measured coercvities as a function of nanomagnet size.

In order to quantify this important effect, we have measured coercivity from the hysteresis loops as a function of size, thickness and symmetry order of the nanomagnets. Coercivity is a measure of the applied field necessary to reduce the magnetisation to zero (i.e. hysteresis loops have a central width of twice the Coercivity) and as such is a measure of how readily an external field can reverse the magnetisation direction of a nanomagnet. This is a key parameter in assessing the suitability of a given magnetic material for technological applications. FIG. 4 shows the results, where, in order to be able to compare different geometries, we express the size of the nanomagnets by the square root of their area. We have confirmed the repeatability of certain of these experimental results on a second set of samples.

The first apparent feature from the data of FIG. 4 is that the 2-fold and 4-fold symmetries display one class of behaviour while the 3-fold and 5-fold symmetries display another class: 2-/4-fold nanomagnets show high coercivities which at first rise with decreasing lengthscale; 3-/5-fold nanomagnets show low coercivities which fall to zero with decreasing lengthscale. The second observation which can be made about FIG. 4 is that in all cases increasing the thickness leads to a strong rise in coercivity, which is not the case in unstructured magnetic films.

The behaviour of the 2-fold nanomagnets is very straightforward and is due to a well understood phenomenon called shape anisotropy. The magnetisation prefers to "streamline" with the longest axis of the nanomagnet in order to minimise the surface area of the pole faces. The field driving this effect is the demagnetising field which passes between pole faces through the inside of the magnet. The demagnetising field scales approximately with the ratio t/a where t is the thickness of the nanomagnet and a is its size and so one sees in FIG. 4A a coercivity which rises with decreasing size.

The effects of the 3-, 4- and 5-fold symmetries are, in contrast, not so easily understood. This is because the demagnetising field of any structure is described by a second rank Cartesian tensor and so can only exhibit uniaxial (2-fold) symmetry. There is therefore no shape anisotropy present, at least in the conventional sense, in the plane of these higher order symmetry structures. Nevertheless, the square nanomagnets clearly experience some reasonably strong impediment to changing the direction of the magnetisation and so there must be some anisotropy present. The fact that this anisotropy is clearly weaker in the triangular magnets shows that although it is not classical shape anisotropy, it is still linked to the shape of the nanomagnet.

Figure 5:
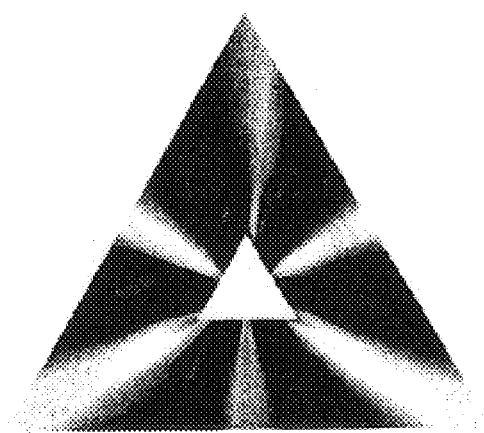
FIG. 5 shows the experimentally measured anisotropy field inside different nanomagnets.
Figure 5:
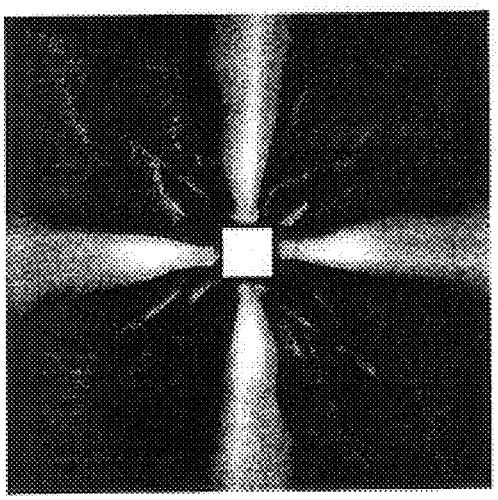
Figure 5:
Figure 5:
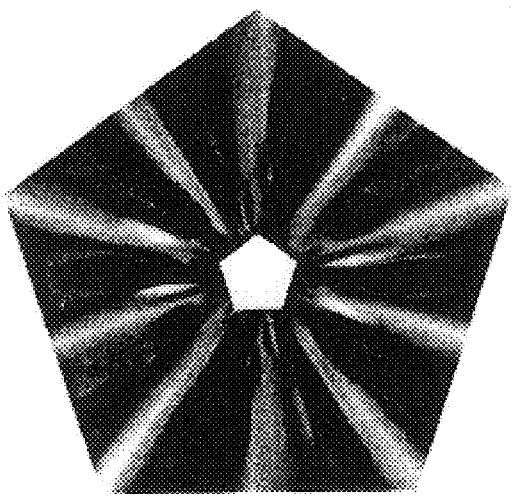

There is a recently discovered feature in square nanomagnets called configurational anisotropy. This comes about because of the very small deviations from uniform magnetisation which occur in nearly all nanomagnets. To date it has not been made clear to what extent this new anisotropy is important in defining the magnetic properties of nanomagnets. In order to test the hypothesis that the varied behaviour which one sees in FIGS. 2 to 4 is due to configurational anisotropy, we have performed a direct measurement of the anisotropy in the nanomagnets using a technique which we call Modulated Field Magneto-optical Anisometry. A strong static magnetic field H (=350 Oe) is applied in the plane of the nanomagnets and a weaker oscillating field $H_t$ (14 Oe amplitude) is applied in the plane of the nanomagnets, perpendicularly to H. The amplitude of the resulting oscillation of the magnetisation is recorded by the same magnetooptical technique used to obtain the hysteresis loops of FIGS. 2 and 3 and is directly related to the amplitude and symmetry of any anisotropy present in the nanomagnet. We have measured experimentally the anisotropy for triangular, square and pentagonal nanomagnets in the size range 50–500 nm at a thickness of 5 nm and present the results in FIG. 5. In these polar plots, the angle gives the in-plane direction φ within the nanomagnet, the radius gives the radius of the nanomagnet in that direction and the colour gives the experimentally measured quantity $$H_a = \frac{1}{M_s}\frac{\partial^2 E}{\partial \phi^2}$$

for a nanomagnet of that size where $M_s$ is the saturation magnetisation (800 emu cm$^{-3}$) and E(φ) is the average magnetic energy density of the nanomagnet when magnetised in the direction φ. Although Ha is not the usual definition of anisotropy field, it can be shown that any oscillations in $H_a$ have the same symmetry order as the underlying anisotropy and an amplitude equal to the magnitude of the anisotropy field. FIG. 5 shows experimental data from 22 different samples of artificial magnetic material (8 sizes of triangles, 8 sizes of squares and 6 sizes of pentagons), each measured in either 19 or 37 different directions φ (0–180° in 10° steps for triangles and squares, 0–180° in 5° steps for pentagons) making a total of 526 measurements.

It is immediately clear from FIG. 5 that there are strong anisotropy fields present in all of the nanomagnets studied. The triangular nanomagnets exhibit anisotropy with 6-fold symmetry, the square nanomagnets show a 4-fold symmetric anisotropy and the pentagonal nanomagnets posses a remarkable 10-fold anisotropy. Frequency doubling occurs in the triangular and pentagonal structures because energy is always quadratic in the magnetisation and so odd symmetry orders cannot be supported.

Figure 6:
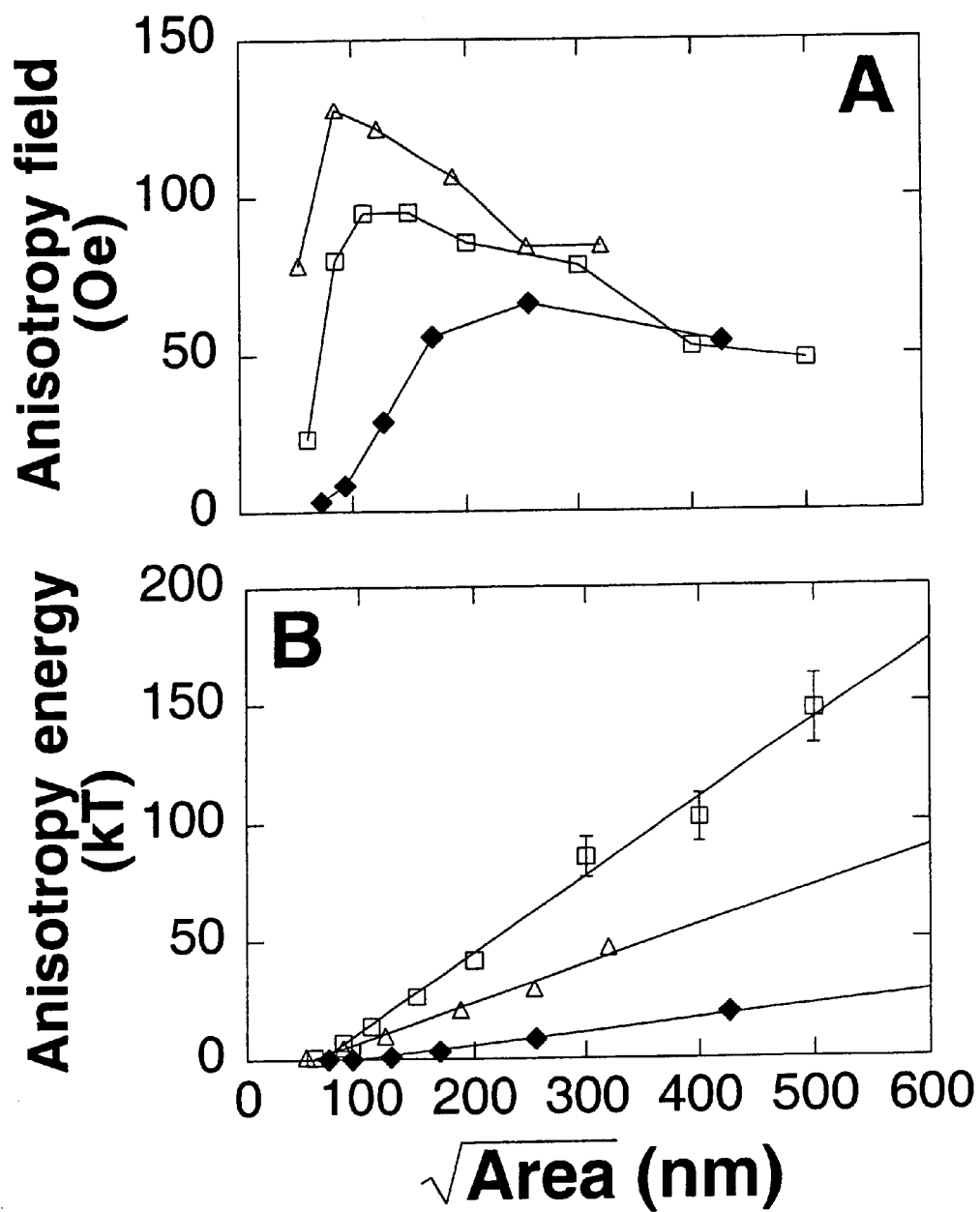
FIG. 6 shows the dominant anisotropy term of FIG. 5 expressed as an anisotropy field (A) and as an anistropy energy per nanomagnet (B) for different nanomagnets.

We have applied a Fourier analysis to the plots of FIG. 5 in order to obtain the magnitude of the anisotropy fields as a function of nanomagnet size and symmetry and show the results in two different forms in FIG. 6. In FIG. 6A we plot the anisotropy fields directly, whereas in FIG. 6B we have plotted the anisotropy energy of a single nanomagnet (in units of kT where k is the Boltzmann constant and T is 298K) using the theoretical relationship $U_a=2M_sH_aV/n^2$. In this equation $U_a$ is the anisotropy energy of a single nanomagnet (in ergs), $H_a$ is the anisotropy field (in Oe), n is the symmetry order of the anisotropy (4 for squares, 6 for triangles, 10 for pentagons) and V is the volume (in cm$^3$) of the nanomagnet. An important element in our understanding of the influence of symmetry order on magnetic properties is provided by the n$^2$ term in this equation. It means that although all of the geometries show approximately similar anisotropy fields in FIG. 6A, they show very different anisotropy energies in FIG. 6B.

The anisotropy energy is particularly interesting because of a phenomenon called superparamagnetism, which is the process by which anisotropy energy barriers can be overcome by the kT thermal energy fluctuations in nanometre scale magnets. As an approximate guide, a barrier can be overcome on the timescale of our measurements once it is less than 10kT in height. This means that once the anisotropy energy is less than 10 kT, one would expect the coercivity to fall rapidly to zero. According to FIG. 6B this should occur once the element size is less than approximately 150 nm, the squares being last to fall as the size is reduced. Conversely, once the anisotropy energy is greater than 10 kT, the coercivity should approximately follow the anisotropy field. This explains the difference in behaviour which one observes in FIG. 4 between the squares on the one hand and the triangles and pentagons on the other. The anisotropy field of the squares (FIG. 6A) shows a peak as the element size is reduced and this peak is reflected directly in the square coercivity data (FIG. 4C). The pentagon anisotropy field shows no peak, and this is also reflected directly in the coercivity data (FIG. 4D), although the fall to zero occurs at a slightly larger size in the coercivity data than in the anisotropy field because of thermal activation. Finally, the triangle anisotropy field does show a peak just like the square, but because the anisotropy energies are lower in the triangle, thermal activation sets in at a larger size and prevents the peak from being seen in the coercivity data (FIG. 4B). We can thus explain the experimentally determined coercivity data as being due to a combination of configurational anisotropy and thermal activation.

Figure 7:
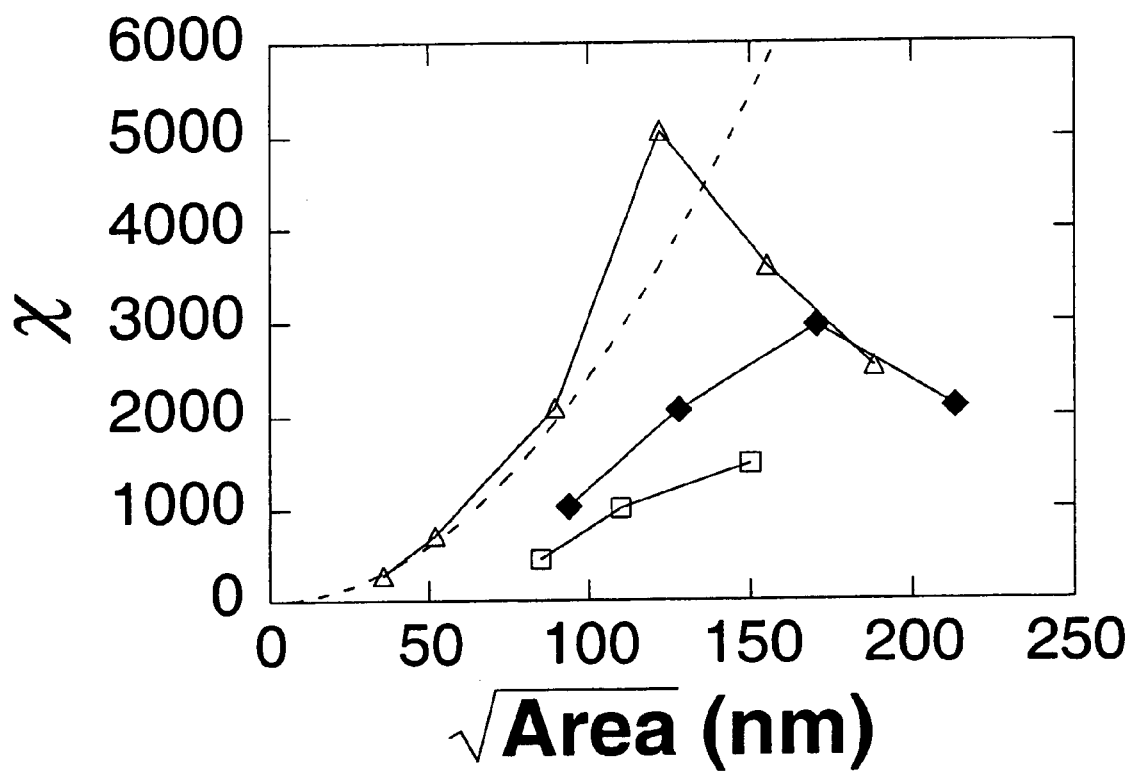
FIG. 7 shows susceptibility as a function of nanomagnet size and symmetry.

High remanence materials possessing finite coercivity (and therefore a memory function) are not the only technologically important magnetic materials. Equally important are the zero remanence, zero coercivity materials which find applications in magnetic sensors and logic elements and in this case it is the susceptibility, X, which is the key parameter. X is defined as $4\pi\partial M/\partial H$ where M is the magnetisation of a nanomagnet and H is the applied magnetic field. X is thus directly proportional to the zero field slope of hysteresis loops such as that shown in FIG. 2F. We have measured X using our magnetooptical experiment (at a frequency of 27 Hz) as a function of nanomagnet size and symmetry at a constant thickness of 3.7±0.5 nm and present the results in FIG. 7. X is only meaningful when the coercivity is zero and so we have restricted ourselves to this case. For comparison, we have also plotted in this figure the theoretical susceptibility derived from the Langevin function. This is a statistical thermodynamic concept which would apply to a single giant spin in free space. Three observations can be made from FIG. 7. Firstly, the experimentally determined susceptibilities of the smallest nanomagnets are all close to the free space Langevin model even though no fitting parameters were used, showing our experimental system to be well controlled. Secondly, the deviations from the Langevin model are greatest for the square symmetry nanomagnets. This is consistent with these possessing the strongest configurational anisotropy energy, meaning that the giant spin contained in a square nanomagnet looks least like a giant spin in free space. It is configurational anisotropy which eventually causes all of the symmetries to fall away from the Langevin model with increasing size. Thirdly, the susceptibilities measured here are two orders of magnitude greater than would have been obtained from magnetic particles of the same shape and aspect ratio but made on a larger than nanometre lengthscale (i.e. micrometers and above, as most conventional magnetic field sensors use). In this latter case, susceptibility comes from the motion of domain walls against the internal demagnetising field, which can be very strong. The unique role of nanometre scale structuring is thus clearly demonstrated.

FIG. 4 and FIG. 5 illustrate well the way in which nanometric structuring really does emulate the creation of new magnetic materials. Supermalloy grows with f.c.c. crystallography which usually results in 2- or 4-fold anisotropy. Nevertheless, FIG. 5A exhibits 6-fold symmetry which is usually reserved for materials with h.c.p. crystallography. In this case the symmetry of the nanomagnet shape (triangular) can be used to emulate a change in crystallographic phase. Similarly, the relatively high coercivities of square and rectangular nanomagnets (FIG. 4A and FIG. 4C) would usually only be found in magnetic materials with a high anisotropy and a weakly coupled microstructure. In this case a careful choice of nanomagnet symmetry emulates a change in element and a change in microstructure. Finally, elementary crystallography dictates that a crystalline lattice cannot possess 10-fold symmetry and so we should not expect to find a naturally occurring crystalline element or alloy with a 10-fold magnetic anisotropy. FIG. 5C, however, shows that we have succeeded in creating one artificially using nanostructuring. In this case nanometric shaping has been used to give a crystalline material a property which is usually reserved for quasi-crystals.

Figure 8:
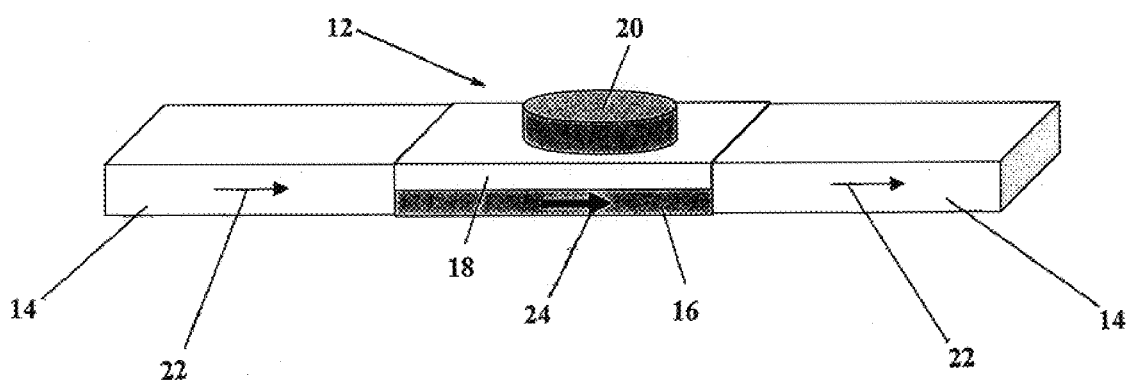
FIG. 8 shows a schematic arrangement of a superparamagnetic nanomagnet in use as a magnetic field sensor or logic element.

The schematic of FIG. 8 shows a possible arrangement using a superparamagnetic nanomagnet as part of a sensor or logic element. A trilayer spin valve 12 is joined at both sides to connector lines 14. The valve 12 comprises a magnetic bottom layer 16, a non-magnetic spacer layer 18 and one or more nanomagnets 20 in a superparamagnetic state as a top layer. Arrows 22 indicate the passage of current across the valve 12 and arrow 24 indicates the magnetisation in the magnetic bottom layer 16.

In conclusion, we have determined the relevance of the symmetry of the shape of nanomagnets on their magnetic properties and have applied it to practical applications. We find that symmetry plays a vital role, allowing magnetic properties to be controlled over a very wide range. We have shown that the key effect linking symmetry to the magnetic properties is configurational anisotropy. This provides new artificial magnetic materials where the magnetic properties can be tailored to a particular application with a very high degree of precision.

The first new idea is the use of configurational anisotropy via the symmetry of the element to tailor magnetic properties. To date, people in the art have only considered rectangular, square or circular elements. We have determined that the configurational anisotropy induced by other shapes such as triangles, pentagons and hexagons can be used to control the magnetic properties of the element. The second new idea is the use of superparamagnetism in nanostructures to remove hysteresis. In conventional materials, superaparamagnetism leads to very high saturation fields, and as such is no use for magnetic sensors. We show here, however, that in nanostructures superparamagnetism can lead to very low saturation fields (a few Oe—see FIG. 2F). By itself this would be very suitable for a sensor or logic element. Even more interesting, however, is the fact that superparamagnetism guarantees a near-zero hysteresis which is a prerequisite for a good sensor (see FIG. 3). The greatest problem facing the current use of nanostructures as sensors is the fact that generally hysteresis becomes greater as the lateral dimensions of the device are reduced.

These two ideas can be combined by setting the configurational anisotropy to a low value by the choice of a suitable shape (triangular, pentagonal or circle) which then allows the nanostructure to become superparamagnetic and hence act as a good sensor or logic element.

What is claimed is:

1. A memory element comprising nanomagnets having a geometric rotational symmetry selected in order to provide high remanence and a suitable coercivity.

2. The element according to claim 1, formed from an artificial magnetic material formed on the surface of a substrate.

3. The element according to claim 1, formed from Supermalloy ($Ni_{80}Fe_{14}Mo_5$).

4. The element according to claim 1, the size range 40–500 nm per side and in the thickness range 3–10 nm.

5. The element according to claim 1, having rotational symmetries to the order 3 or 5.

6. A sensor element comprising nanomagnets having a geometric rotational symmetry selected such that they are superparamagnetic and exhibit substantially zero hysteresis so that a magnetization of the nanomagnets depends only on the current value of applied field and not on the field history.

7. The sensor element according to claim 6, formed from an artificial magnetic material formed on the surface of a substrate the axis being substantially perpendicular to the surface.

8. The sensor element according to claim 7, formed from Supermalloy ($Ni_{80}Fe_{14}Mo_5$).

9. The sensor element according to claim 7, the size range 40–500 nm per side and in the thickness range 3–10 nm.

10. The sensor element according to claim 6, having rotational symmetries to the order 3 or 5.

11. A magnetic logic element comprising nanomagnets having a geometric rotational symmetry selected such that they are superparamagnetic and exhibit substantially zero hysteresis so that a magnetization of the nanomagnets depends only on the current value of applied field and not on the field history.

12. The logic element according to claim 11, formed from an artificial magnetic material formed on the surface of a substrate, the axis being substantially perpendicular to the surface.

13. The logic element according to claim 11, formed from Supermalloy ($Ni_{80}Fe_{14}Mo_5$).

14. The logic element according to claim 11, the size range 40–500 nm per side and in the thickness range 3–10 nm.

15. The logic element according to claim 11, having rotational symmetries to the order 3 or 5.

* * * * *